United States Patent [19]

Belopolsky

[11] Patent Number: 5,407,360
[45] Date of Patent: Apr. 18, 1995

[54] CONNECTOR FOR HIGH DENSITY ELECTRONIC ASSEMBLIES

[75] Inventor: Yakov Belopolsky, Harrisburg, Pa.
[73] Assignee: Berg Technology, Inc., Reno, Nev.
[21] Appl. No.: 81,466
[22] Filed: Jun. 22, 1993
[51] Int. Cl.$^6$ .......................................... H01R 23/72
[52] U.S. Cl. ........................................ 439/71; 439/70
[58] Field of Search ..................... 439/69–73, 439/525, 526, 330, 331, 218

[56] References Cited

U.S. PATENT DOCUMENTS

| | | | |
|---|---|---|---|
| 3,864,004 | 2/1975 | Friend | 439/876 |
| 4,183,611 | 1/1980 | Casciotti et al. | 439/876 |
| 4,538,864 | 9/1985 | Ichimura | 439/71 |
| 4,737,884 | 4/1988 | Wada et al. | 439/69 |
| 4,746,299 | 5/1988 | Matsuoka et al. | 439/70 |
| 5,018,981 | 5/1991 | Matsuoka | 439/72 |
| 5,104,324 | 4/1992 | Grabbe et al. | 439/62 |
| 5,199,884 | 4/1993 | Kaufman et al. | 439/74 |

*Primary Examiner*—Neil Abrams
*Attorney, Agent, or Firm*—Woodcock, Washburn, Kurtz, Mackiewicz & Norris

[57] ABSTRACT

An improved connector for an electronic module of the type that has a number of leads positioned on an underside adjacent to at least one edge thereof includes a housing having a socket opening that is sized and configured to accept an electronic module, and a plurality of terminals mounted to the housing. Each of the terminals has a first leg portion that includes a cam surface that is constructed and arranged to be engaged by an edge of an electronic module during insertion to control insertion force and distance, and a second leg portion that is connected to the first leg portion and has a contact surface for contacting at least one lead on an underside of the electronic module. An elastomeric absorber is positioned between the second leg portion and the housing for biasing the second leg portion upwardly against the underside of the electronic module when the electronic module is fully inserted into said connector. The elastomeric absorber may have conductive traces deposited thereon for establishing electrical connections between the terminals. As a result, contact forces and insertion forces can be precisely set in a simple and inexpensive manner.

22 Claims, 4 Drawing Sheets

CONNECTOR FOR HIGH DENSITY ELECTRONIC ASSEMBLIES

BACKGROUND OF THE INVENTION

1. Field of the Invention

This invention relates to an improved connector for connecting an electronic module or package, such as a multichip module, to a circuit board.

2. Description of the Prior Art

An important trend in the electronics industry has been the increasing utilization of integrated circuits as individual components due to their relatively inexpensive cost, miniature size, and electrical dependability. Today it is common for hundreds of complex integrated circuits to be treated as discrete components by the design engineer, with such integrated circuits being appropriately packaged and electrically connected to their associated printed circuit boards.

A multichip module can be defined as a packaging technology that places several such semiconductor chips, interconnected with a high-density substrate, into a single package. Multichip nodules often contain ASICs, microprocessors, and RCM circuits that require complex interconnect ribbon routings. Multichip modules and other such dense electronic assemblies typically include a large number of electrical terminals, and require electronic connectors that have a large number of densely packed electrical contacts. Often, the terminals are positioned on all four edges of a rectangular module, and a socket-type electrical connector having contacts located on four different sides is used for connecting the module to a circuit board.

Presently, several different techniques are being used to connect a high-density module to a circuit board such as a printed wiring board or mother board. One technique involves mounting the module to an elastomeric contact strip that has a pattern of conductive traces deposited thereon. Systems utilizing this technique, however, tend to be temperature-dependent, have relatively low reliability, require a cumbersome pressure fixture, are relatively large and require many parts.

A second connection technique involves attaching a multi-layer ceramic package to a circuit board with outside solder joints. Unfortunately, such packages are relatively expensive and very difficult to rework.

A third connection technique involves a multi-layer ceramic pin grid array. This tends to be expensive, though, and is not the more preferred surface mount technology ("SMT") design.

A fourth technique involves providing a socket for a leaded chip carrier. Such sockets, however, are not adjustable or readily designed to control contact and insertion forces, cannot regulate substrate stresses, and tend not to accommodate wide tolerances of chip packages or modules.

It is clear that there is a long and unfilled need in the prior art for an improved connector for a high-density leaded or leadless electronic module that allows for simple and effective regulation of insertion and withdrawal forces, is able to accept unpackaged electronic modules, is self-aligning and locking, and that accommodates wide tolerances.

SUMMARY OF THE INVENTION

Accordingly, it is an object of the invention to provide an improved connector for a high-density electronic module that is inexpensive and simple in construction.

It is further an object of the invention to provide an improved connector for an electronic module that is able to accept a leaded or leadless multichip module or similar high-density electronic package.

It is further an object of the invention to provide an improved connector for a high-density electronic module that accommodates wide tolerances, and that is self-locking, self-aligning, and minimizes vibration effects.

It is yet further an object of the invention to provide an improved connector for an electronic module that allows for precise, yet simple, regulation of insertion and withdrawal forces.

It is yet further an object of the invention to provide an improved connector for an electronic module that provides a significant wiping distance between contacts during insertion and withdrawal to keep the contact surfaces clean and to ensure a good electrical connection.

In order to achieve the above and other objects of the invention, an improved connector for an electronic module of the type that has a plurality of leads positioned on an underside adjacent to at least one edge thereof includes, according to the first aspect of the invention, a housing defining an opening that is sized and configured to accept an electronic module; a plurality of terminals, each of the terminals having a foot portion that is secured to the housing, a resilient first leg portion that is cantilevered to the foot portion and includes a cam surface that is constructed and arranged to be engaged by an edge of an electronic module during insertion to control insertion force and distance; and a second leg portion that is connected to the first leg portion and has a contact surface on an upper surface for contacting at least one lead on an underside of an electronic module, whereby the terminals both regulate insertion force and established desired electrical connections with the electronic module.

According to a second aspect of the invention, an improved connector for an electronic module of the type that has a plurality of leads positioned on an underside adjacent to at least one edge thereof includes a housing defining an opening that is sized and configured to accept an electronic module, at least one first type of terminal mounted to the housing, each of the first type of terminal having a first leg portion that includes a cam surface that is constructed and arranged to be engaged by an edge of an electronic module during insertion to control insertion force and distance, a second leg portion that is connected to the first leg portion and has a contact surface for contacting at least one lead on an underside of the electronic module; and at least one universal-type terminal mounted to the housing, each of the universal type of terminal having a first leg portion that includes a cam surface that is constructed and arranged to be engaged by an edge of the electronic module during insertion to control insertion force and distance, a second leg portion that is connected to the first leg portion and has a contact surface for contacting at least one lead on an underside of an electronic module, and a slot defined therein between the first leg portion and the second leg portion for receiving a contact pin that is mounted to the electronic module, whereby the connector is adapted to connect to a module, having both flat leads and protruding contact pins, and so that contact pins can be used to align the connector to the electronic module.

According to a third aspect of the invention, an improved connector for an electronic module of the type that has a plurality of leads positioned on an underside adjacent to at least one edge thereof includes a housing defining an opening that is sized and configured to accept an electronic module; a plurality of terminals mounted to the housing, each of the terminals having a first leg portion that includes a cam surface that is constructed and arranged to be engaged by an edge of an electronic module during insertion to control insertion force and distance, and a second leg portion that is connected to the first leg portion and has a contact surface for contacting at least one lead on an underside of an electric module; and compressive biasing structure for biasing the second leg portion upwardly against the underside of the electronic module when the electronic module is fully inserted into the connector, whereby contact force between the second leg portion and the module is maintained.

These and various other advantages and features of novelty which characterize the invention are pointed out with particularity in the claims annexed hereto and forming a part hereof. However, for a better understanding of the invention, its advantages, and the objects obtained by its use, reference should be made to the drawings which form a further part hereof, and to the accompanying descriptive matter, in which there is illustrated and described a preferred embodiment of the invention.

DETAILED DESCRIPTION OF THE PREFERRED EMBODIMENT(S)

Figure 1:
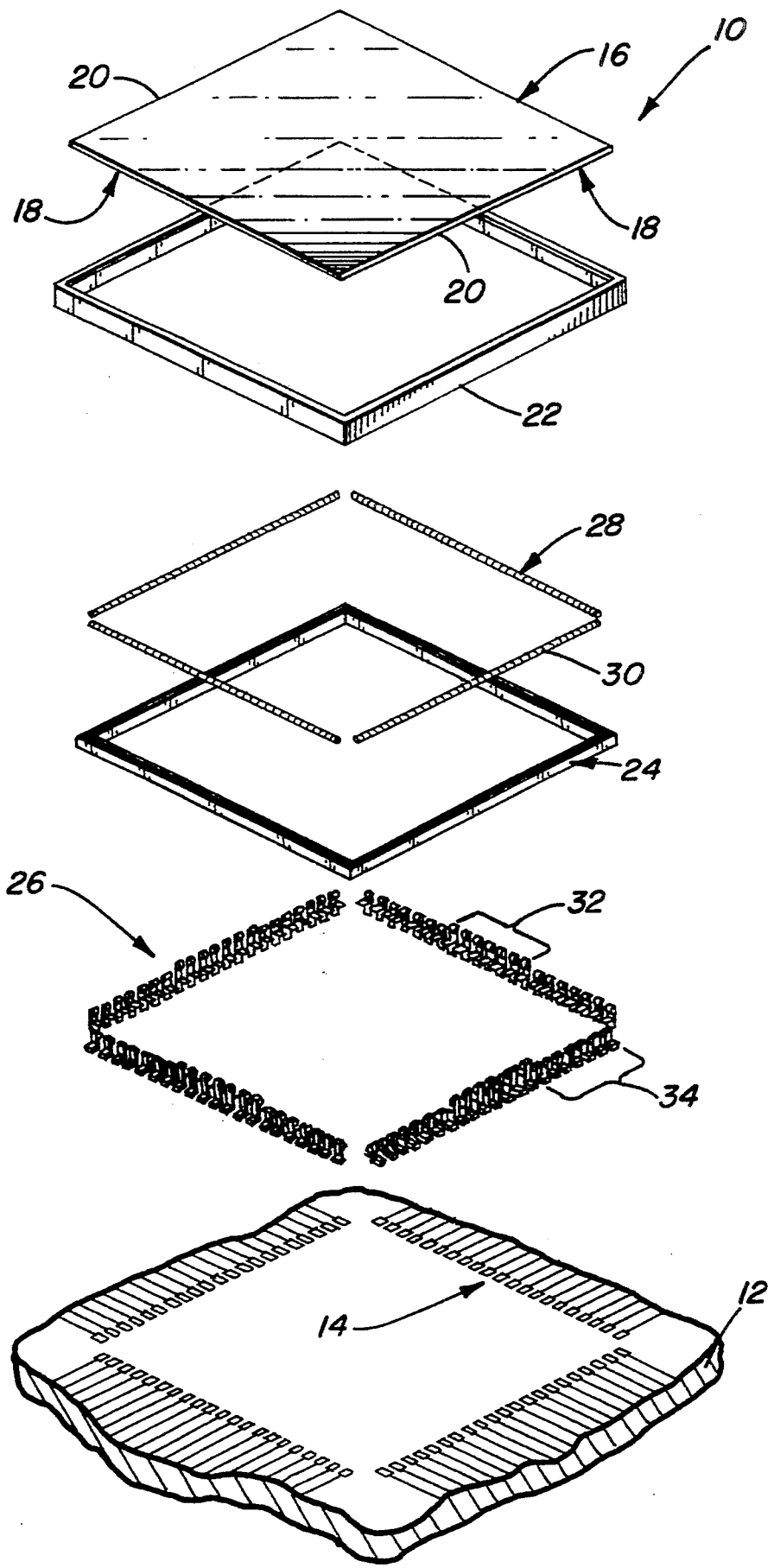
FIG. 1 is an exploded perspective view of an improved connector according to a preferred embodiment of the invention.

Referring now to the drawings, wherein like reference numerals designate corresponding structure throughout the views, and referring in particular to FIG. 1, an improved connector 10 is constructed and arranged to be attached to a motherboard or substrate 12 that has contacts 14 thereon.

Connector 10 is adapted to receive an electronic module 16 that is of the type that has a plurality of leads 18 positioned on an underside thereof adjacent to one or more edges 20 of the electronic module 16. Leads 18 can be substantially flat contact pads that are flush against the underside of module 16, or leads 18 may be contact pins that are bent downwardly orthogonally to the plain of the underside of module 16. Electronic module 16 is, for example, a multichip module of the type that includes several semiconductor chips interconnected with a high-density substrate into a single package.

Figure 2:
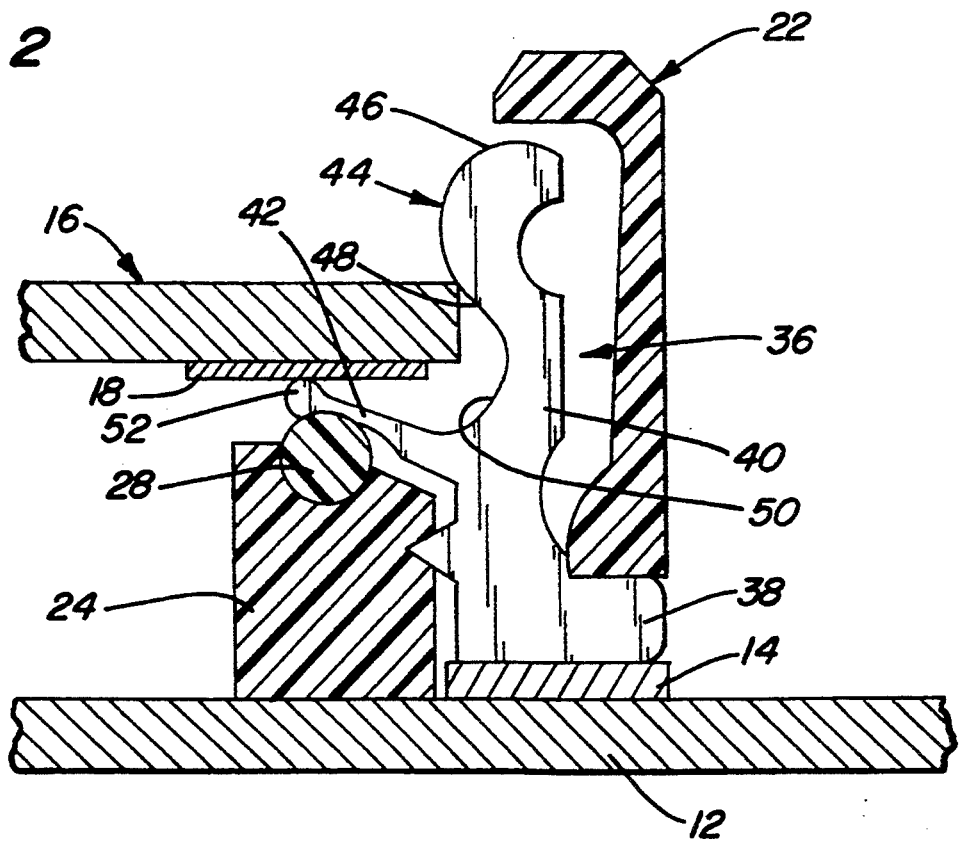
FIG. 2 is a fragmentary cross-sectional view of one component in the system depicted in FIG. 1.
Figure 3:
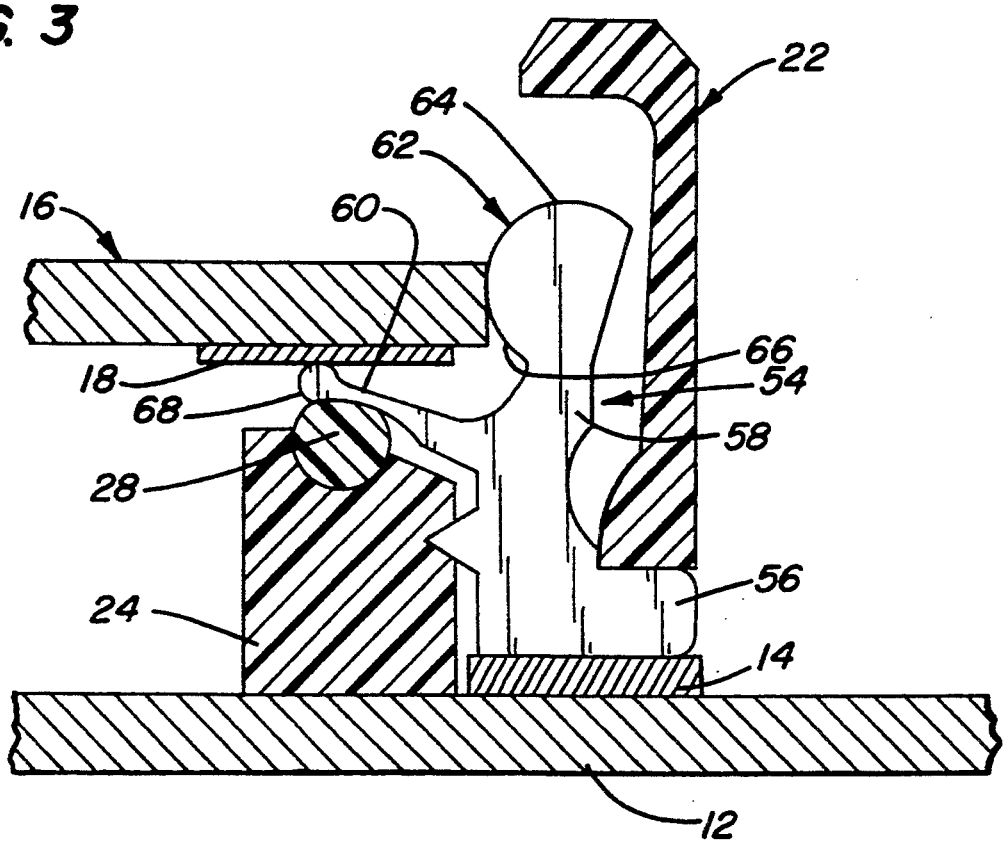
FIG. 3 is a fragmentary cross-sectional view of another component in the system depicted in FIGS. 1 and 2.
Figure 4:
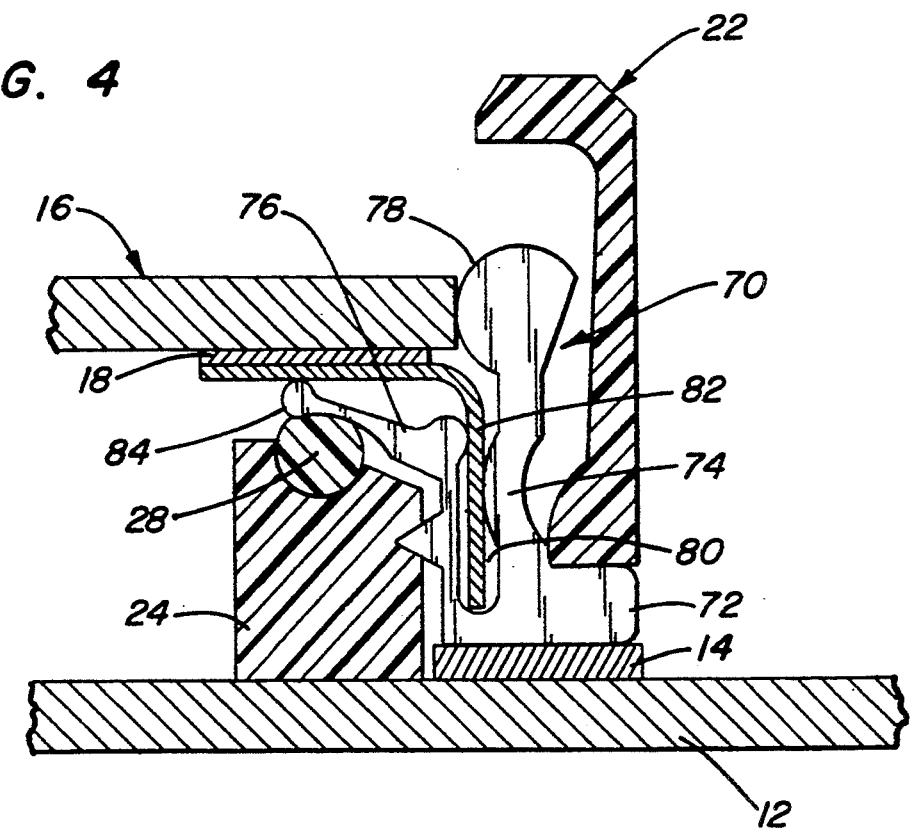
FIG. 4 is a fragmentary cross-sectional view of a third component in the system depicted in FIGS. 1-3.
Figure 5B:
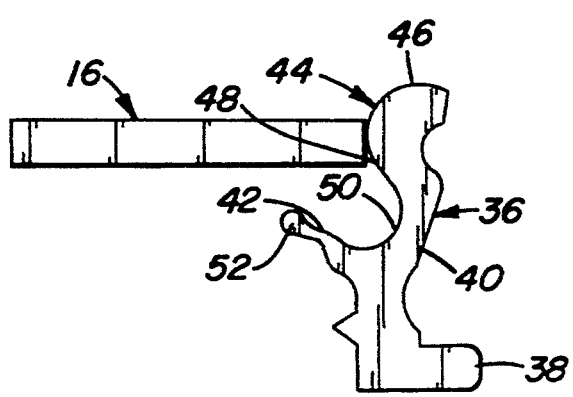
FIGS. 5A-5D are a diagrammatical depiction of the connector depicted in FIGS. 1-4 while a connection is being made.
Figure 5C:
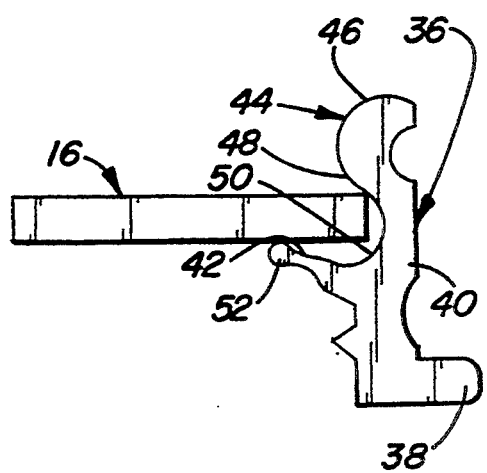
Figure 5A:
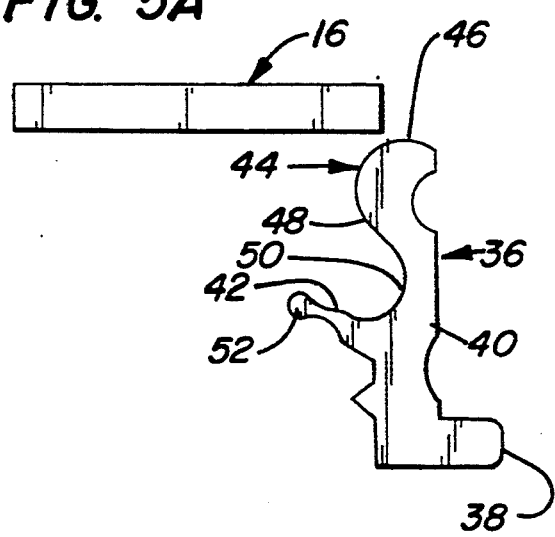
Figure 5D:
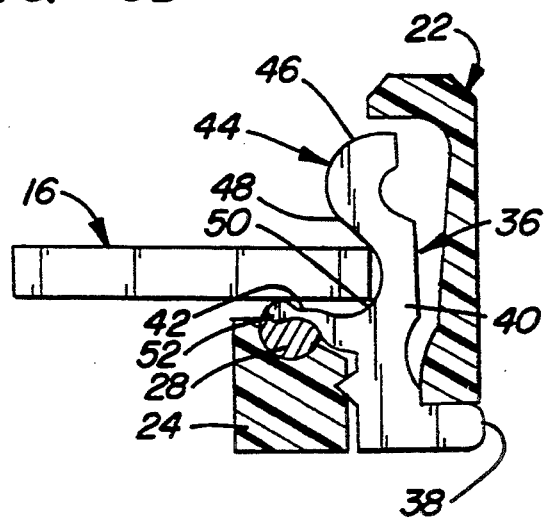

As is best shown in FIGS. 1-4, connector 10 preferably includes a housing that has an outer housing portion 22 and an inner housing portion 24. Housing portions 22-24 are preferably fabricated from a non-conductive, non-metallic material, such as hard plastic. As is best shown in FIGS. 2, 3 and 4, a plurality of terminals 26 are positioned between outer housing portion 22 and inner-housing portion 24. Referring briefly to FIG. 1, it will be seen that terminals 26 include a first group 32 of taller terminals 36, which are shown in detail in FIG. 2, and a second group 34 of shorter terminals 54, which are shown in detail in FIG. 3. Certain terminals from the second group 34 may be constructed as universal terminals 70, which are depicted in detail in FIG. 4. The purpose, construction and operation of the various types of terminals 36, 54, 70 is discussed at length and greater detail below.

Turning now to FIG. 2, a terminal 36 from the first, taller group of terminals includes a foot portion 38 that is securely mounted to outer housing 22 and inner housing 24. Foot portion 38 is also in electrical connection with the conductive pad 14 on substrate 12. Terminal 36 further includes a first leg portion 40 that is resilient and is cantilevered to foot portion 38. First leg portion 40 includes a cam surface 44 that is constructed and arranged to be engaged by an edge 20 of electronic module 16 during insertion to control insertion force and duration. The insertion process will be discussed below in greater detail with reference to FIGS. 5 (a)-5 (d). Referring again to FIG. 2, it will be seen that cam surface 44 includes a rise portion 46, a slide portion 48 and a recess 50 that is defined between first leg portion 40 and a second leg portion 42 that is connected to first leg portion 40. Second leg portion 42 is preferably positioned at an acute angle with respect to first leg portion 40, and has a contact surface 52 on an upper surface thereof for contacting at least one lead 18 on an underside of electronic module 16.

As can further be seen in FIG. 2, an elastomeric absorber 28 is positioned in a recess in inner housing 24 between inner housing 24 and a lower surface of the second leg portion 42. Elastomeric absorber 28 preferably has conductive traces 30 selectively deposited thereon for connecting certain of the terminals 36 to a ground terminal. Alternatively, the selective conductive traces 30 on elastomeric absorber 28 can be arranged as part of the circuitry in the electronic module 16 that is being connected to the substrate 12.

Referring now to FIG. 3, a shorter type terminal 54 from the second group 34 includes a foot portion 56 that is securely anchored between the outer housing 22 and the inner housing 24. Foot portion 56 is an electrical contact with the conductive pad 14 there beneath, to provide an electrical connection to the substrate 12. Terminal 54 includes a first leg portion 58 that, like the first leg portion 40 of terminal 36, is positioned substantially parallel to the intended direction of insertion of the electronic module 16. First leg portion 58, however, is substantially shorter than the first leg portion 40 of terminal 36. First leg portion 58 includes a cam surface 62 having a rise portion 64 and a slide portion 66. Terminal 54 further includes a second leg portion 60 that is cantilevered outwardly from a mid portion of first leg portion 58, and extends from first leg portion 58 at an acute angle. Second leg portion 60 includes a contact surface 68 that is adapted to contact the lead 18 on the underside of electronic module 16 when electronic module 16 is in the position illustrated in FIG. 3. Second leg portion 60 further contacts elastomeric absorber 28 on a lower side thereof. Again, elastomeric absorber 28 is provided with conductive traces 30 that may or may not be configured so as to electrically connect with second leg portion 60, depending upon the intended function of the terminal 54.

Turning now to FIG. 4, a universal terminal 70 is identical in height to the terminal 54 from the second group 34. Universal terminal 70 includes a foot portion 72 that is securely between outer housing 22 and inner housing 24, as may be seen in FIG. 4. Foot portion 72 is in electrical contact with the conductive pad 14 there beneath, so that an electrical connection is securely established with the underlying substrate 12. A first leg portion 74 is cantilevered from foot portion 72 so as to extend upwardly substantially parallel to the intended direction of insertion of electronic module 16. First leg portion 74 has a second leg portion 76 attached thereto, with the main portion of second leg portion 76 being positioned at an acute angle with respect to the first leg portion 74. A cam surface 78 identical to that on terminal 54 is positioned at a distal end of first leg portion 74. A deep slot 80 is defined in terminal 70 between first leg portion 74 and second leg portion 76, as shown in FIG. 4. Second leg portion 76 includes a contact surface 84 on an upper surface for making contact with a lead 18 of electronic module 16.

As is shown in FIG. 4, some leads 18 of electronic module 16 may have a downwardly extending contact pin 82 attached thereto. In such cases, contact pin 82 will be received within the slot 80 that is defined between the first leg portion 74 and the second leg portion 76 in universal terminal 70. Universal terminal 70, then, is adapted to be securely connected to both leads 18 that are flushed with an underside of electronic module 16, or contact pins 82 that extend downwardly and orthogonally from the plain of electronic module 16.

In operation, an electronic module 16 may have a number of electrical contacts spaced there around adjacent to the different edges 20, with some contacts being, similar to leads 18, flush against the underside of module 20, and other contacts of the contact pin 82 type. To insert the electronic module 16 into a connector 10 according to the invention, the module 16 is aligned with the connector 10, and is pressed downwardly so that the edges 20 of module 16 first bear against the rise portion 46 of the cam surface 44 on the terminals 36 from the first, taller group 32. At this point, depending upon the resiliency of the first leg portion 40 of the terminals 36 from the first group 32, and on the number of terminals 36 that are in the first group 32, some degree of force is required to continue inserting the module 16 into the connector 10. It will readily be appreciated that the amount of force that is required can be adjusted by either adjusting the physical characteristics of the respective first leg portions 40, whereby varying the number of terminals 36 that are in the first group 32. As the module 16 continues to be pushed into the connector 10, the respective edges 20 of module 16 will begin to descend the slide portion 48 of the terminals 36 from the first group 32, while at the same time beginning to engage the cam surfaces 78, 62 of the universal terminals 70 and the terminals 54 from the second group of shorter terminals 34. By varying the spacing and degree and descent of the slide portions 48 relative to the shape of the cam surfaces 62, 78, the insertion force at this point can be precisely set and maintained. As the module 16 continues to be pressed downwardly, the leads 18 on the underside of module 16 will be pressed into engagement with the contact surfaces 52, 68, 84 of the second leg portions 42, 60, 76 of the different connector types, respectively, 36, 54, 70. Simultaneously, contact pins 82 will be pressed down into the slots 80 of the matching universal terminal 70. By providing universal terminals 70, selectively along the periphery of connector 10 so as to match with corresponding contact pins 82 on electronic module 16, the alignment between module 16 and connector 10 will be apparent to maintenance and assembly personnel.

It is to be understood, however, that even though numerous characteristics and advantages of the present invention have been set forth in the foregoing description, together with details of the structure and function of the invention, the disclosure is illustrative only, and changes may be made in detail, especially in matters of shape, size and arrangement of parts within the principles of the invention to the full extent indicated by the broad general meaning of the terms in which the appended claims are expressed.

What is claimed is:

1. An improved connector for an electronic module of the type that has a plurality of leads positioned on an underside adjacent to at least one edge thereof, comprising:
   a housing defining an opening that is sized and configured to accept an electronic module;
   a plurality of terminals, each of said terminals having:
      a foot portion that is secured to said housing;
      a resilient first leg portion that is cantilevered to said foot portion and includes a cam surface that is constructed and arranged to be engaged and deflected outwardly by an edge of an electronic module during insertion to control insertion force and distance;
      a second leg portion that is separate from yet connected to said first leg portion and is positioned at an acute angle with said first leg portion so as to define a recess between said first leg portion and said second leg portion, said second leg portion having and has a contact surface on an upper surface for contacting at least one lead on an underside of an electronic module, whereby said terminals both regulate insertion force and establish desired electrical connections with an electronic module; and;
   Compressive biasing means for biasing said second leg portion upwardly against the underside of the electronic module when the electronic modular is fully inserted into said connector, whereby contact force is maintained.

2. A connector according to claim 1, wherein said housing defines a socket opening having more than one side, and said terminals are arranged on more than one side of said housing about said opening, whereby said connector is adapted to connect to electronic modules having leads positioned adjacent to more than one edge.

3. A connector according to claim 1, wherein said first leg portion is positioned substantially parallel to an intended direction of insertion for module, and said cam surface comprises a curved surface on one side of said first leg portion.

4. A connector according to claim 1, wherein a first group of said terminals have first leg portions with cam surfaces that are at a first height with respect to said housing, and a second group of said terminals have cam surfaces that are at a second height with respect to said housing, whereby insertion force and distance is further controlled.

5. A connector according to claim 1, wherein said compressive biasing means comprises an elastomeric absorber positioned between said second leg portion and said housing.

6. A connector according to claim 5, wherein said elastomeric absorber has at least one conductor deposited thereon for making electrical contact with said second leg portion.

7. A connector according to claim 1, wherein a group of said terminals have a slot defined therein between said first leg portion and said second leg portion for receiving a contact pin that is mounted to the electronic module, whereby said connector is adapted to connect to a module having both flat leads and protruding contact pins.

8. An improved connector for an electronic module of the type that has a plurality of leads positioned on an underside adjacent to at least one edge thereof, comprising:
  a housing defining an opening that is sized and configured to accept an electronic module;
  at least one first type of terminal mounted to said housing, each of said first type of terminal having a first leg portion that includes a cam surface that is constructed and arranged to be engaged by an edge of an electronic module during insertion to control insertion force and distance, a second leg portion that is connected to said first leg portion and has a contact surface for contacting at least one lead on an underside of an electronic module; and
  at least one universal type terminal mounted to said housing, each of said universal type of terminal having a first leg portion that includes a cam surface that is constructed and arranged to be engaged by an edge of an electronic module during insertion to control insertion force and distance, a second leg portion that is connected to said first leg portion and has a contact surface for contacting at least one lead on an underside of an electronic module, and a slot defined therein between said first leg portion and said second leg portion for receiving a contact pin that is mounted to the electronic module, whereby said connector is adapted to connect to a module having both flat leads and protruding contact pins, and so that contact pins can be used to align said connector to the electronic module.

9. A connector according to claim 8, wherein said housing defines a socket opening having more than one side, and said terminals are arranged on more than one side of said housing about said opening, whereby said connector is adapted to connect to electronic modules having leads positioned adjacent to more than one edge.

10. A connector according to claim 8, wherein said second leg portions of said first type of terminal is positioned at an acute angle with respect to said first leg portion.

11. A connector according to claim 10, wherein each of said first type of terminals has a recess defined between said first and second leg portions for securely receiving an edge of the module during connection.

12. A connector according to claim 8, wherein said first leg portion of said first type of terminals is positioned substantially parallel to an intended direction of insertion for module, and said cam surface comprises a curved surface on one side of said first leg portion.

13. A connector according to claim 8, wherein a first group of said first type of terminals have first leg portions with cam surfaces that are at a first height with respect to said housing, and a second group of said first type of terminals have cam surfaces that are at a second height with respect to said housing, whereby insertion force and distance is further controlled.

14. A connector according to claim 8, further comprising compressive biasing means for biasing said second leg portion of both types of terminals upwardly against the underside of the electronic module when the electronic module is fully inserted into said connector, whereby contact force between said second leg portion and said module is maintained.

15. A connector according to claim 14, wherein said compressive biasing means comprises an elastomeric absorber positioned between said second leg portion and said housing.

16. A connector according to claim 15, wherein said elastomeric absorber has at least one conductor deposited thereon for making electrical contact with said second leg portion.

17. An improved connector for an electronic module of the type that has a plurality of leads positioned on an underside adjacent to at least one edge thereof, comprising:
  a housing defining an opening that is sized and configured to accept an electronic module;
  a plurality of terminals mounted to said housing, each of said terminals having a first leg portion that includes a cam surface that is constructed and arranged to be engaged by an edge of an electronic module during insertion to control insertion force and distance, and a second leg portion that is connected to said first leg portion and has a contact surface for contacting at least one lead on an underside of an electronic module; and
  compressive biasing means for biasing said second leg portion upwardly against the underside of the electronic module when the electronic module is fully inserted into said connector, said compressive biasing means being structurally independent from said second leg portion, whereby contact force between said second leg portion and said module is maintained.

18. A connector according to claim 17, wherein said compressive biasing means comprises an elastomeric absorber positioned between said second leg portion and said housing.

19. A connector according to claim 18, wherein said elastomeric absorber has at least one conductor deposited thereon for making electrical contact with said second leg portion.

20. An improved connector for an electronic module of the type that has a plurality of leads positioned on an underside adjacent to at least one edge thereof, comprising;
  a housing defining an opening that is sized and configured to accept an electronic module;
  a plurality of terminals, each of said terminals having;
    a foot portion that is secured to said housing;
    a resilient first leg portion that is cantilevered to said foot portion and includes a cam surface that is constructed and arranged to be engaged by an edge of an electronic module during insertion to control insertion force and distance; and
    a second leg portion that is connected to said first leg portion and has a contact surface on an upper surface for contacting at least one lead on an underside of an electronic module, whereby said terminals both regulate insertion force and establish desired electrical connections with an electronic module, wherein a first group of said terminals have first leg portion with cam surfaces that are at a first height with respect to said housing, and a second group of said terminals have cam surfaces that are at a second height with respect to said housing, whereby insertion force and distance are further controlled.

21. An improved connector for an electronic module of the type that has a plurality of leads positioned on an underside adjacent to at least one edge thereof, comprising:

a housing defining an opening that is sized and configured to accept an electronic module;

a plurality of terminals, each of said terminals having:

a foot portion that is secured to said housing;

a resilient first leg portion that is cantilevered to said foot portion and includes a cam surface that is constructed and arranged to be engaged by an edge of an electronic module during insertion to control insertion force and distance; and a second leg portion that is cantilevered outwardly from a mid portion of said first leg portion and has a contact surface on an under surface for contacting at least one lead on an underside of an electronic module, whereby said terminals both regulate insertion force and establish desired electrical connections with an electronic module.

22. An improved connector for an electronic module of the type that has a plurality of leads positioned on an underside adjacent to at least one edge thereof, comprising:

a housing defining an opening that is sized and configured to accept an electronic module;

a plurality of terminals mounted to said housing, each of said terminals having a first leg portion that includes a cam surface that is constructed and arranged to be engaged by an edge of an electronic module during insertion to control insertion force and distance, and a second leg portion that is connected to said first leg portion and has a contact surface for contacting at least one lead on an underside of an electronic module; and compressive biasing means for biasing said second leg portion upwardly against the underside of the electronic module when the electronic module is fully inserted into said connector, said compressive biasing means being coactive between said housing and said second leg portion, whereby contact force between said second leg portion and said module is maintained.

* * * * *